(12) United States Patent
Chiu

(10) Patent No.: US 11,031,462 B1
(45) Date of Patent: Jun. 8, 2021

(54) SEMICONDUCTOR STRUCTURE WITH IMPROVED GUARD RING STRUCTURE

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/724,393

(22) Filed: Dec. 23, 2019

(51) Int. Cl.
*H01L 29/06* (2006.01)
*H01L 23/48* (2006.01)

(52) U.S. Cl.
CPC ........ *H01L 29/0619* (2013.01); *H01L 23/481* (2013.01)

(58) Field of Classification Search
CPC H01L 23/481; H01L 29/0619; H01L 29/0623
See application file for complete search history.

(56) References Cited

U.S. PATENT DOCUMENTS

| 5,760,446 A * | 6/1998 | Yang ................. H01L 27/0266 257/357 |
| 9,541,521 B1 * | 1/2017 | Hoque ............... G01N 27/4148 |
| 2010/0237386 A1 * | 9/2010 | Lin ..................... H01L 25/0657 257/173 |
| 2016/0300827 A1 * | 10/2016 | Vendt ................... H01L 27/067 |

* cited by examiner

*Primary Examiner* — Herve-Louis Y Assouman
(74) *Attorney, Agent, or Firm* — CKC & Partners Co., LLC

(57) ABSTRACT

A semiconductor structure includes a semiconductor wafer having a topside and a backside. The wafer includes a first semiconductor well of a first conductive type, a second semiconductor well of a second conductive type different from the first conductive type, a plurality of first semiconductor doped regions of the first conductive type and a plurality of first through silicon vias (TSVs) filled with conductive material. The first semiconductor well is formed within the second semiconductor well and exposed to the topside. The semiconductor device and the first semiconductor doped regions are formed within the first semiconductor well, and the first semiconductor doped regions surround the semiconductor device. Each first TSV extends into a corresponding one of the first semiconductor doped regions from the backside through the first and second semiconductor wells and is connected to a DC voltage or a ground potential from the backside.

10 Claims, 13 Drawing Sheets

SEMICONDUCTOR STRUCTURE WITH IMPROVED GUARD RING STRUCTURE

BACKGROUND

Field of Invention

The present disclosure relates to a semiconductor structure with an improved guard ring structure.

Description of Related Art

In order to avoid undesired conductions between PN junctions, a guard ring is necessary for N well or P well pick up or latch up concern. For example, as a transistor is formed within a P well, a guard ring can be designed with active areas of ring shape as $P^+$ pick up connected by contacts distribution around the guard ring, and the guard ring surrounds the transistor.

SUMMARY

One aspect of the present disclosure is relative to a semiconductor structure.

According to one embodiment of the present disclosure, a semiconductor structure includes a semiconductor wafer. The semiconductor wafer is with a topside and a backside. The wafer includes a first semiconductor well of a first conductive type, a second semiconductor well of a second conductive type different from the first conductive type, a plurality of first semiconductor doped regions of the first conductive type and a plurality of first through silicon vias (TSVs). The first semiconductor well is formed within the second semiconductor well and exposed to the topside. The semiconductor device is formed within the first semiconductor well. The first semiconductor doped regions is formed within the first semiconductor well. The first semiconductor doped regions surround the semiconductor device. Each first TSV extends into a corresponding one of the first semiconductor doped regions from the backside through the first and second semiconductor wells and is filled with a conductive material, and each first TSV is connected to a DC voltage or a ground potential from the backside.

In one or more embodiments of the present disclosure, the semiconductor wafer of the semiconductor structure further includes a plurality of conductive bumps. Each conductive bump is disposed on the backside and connected to a corresponding one of the first TSVs, and each conductive bump is connected to a DC voltage or a ground potential.

In one or more embodiments of the present disclosure, the semiconductor wafer of the semiconductor structure further includes a redistribution layer formed on the backside. The redistribution layer is connected to the first through silicon vias and a conductive bump is located over the redistribution layer. The conductive bump is connected to a DC voltage or a ground potential.

In one or more embodiments of the present disclosure, the semiconductor wafer of the semiconductor structure further includes a plurality of second doped semiconductor regions of the second conductive type and a plurality of second TSVs. The second doped semiconductor regions are formed within the second semiconductor well. The second semiconductor doped regions surround the first semiconductor well. Each second TSV extends into a corresponding one of the second semiconductor doped regions from the backside through the second semiconductor well and is filled with a conductive material.

In one or more embodiments of the present disclosure, the semiconductor device is a transistor. The semiconductor wafer further includes an isolation region formed between the first semiconductor doped regions and the transistor. The transistor is surrounded by the isolation region.

In some embodiments, the semiconductor wafer of the semiconductor structure further includes an insulating layer and a conductive line. The insulating layer is formed over the topside and covering the transistor. The conductive line is formed over the insulating layer and connected to the transistor. The conductive line overlaps the first semiconductor doped regions.

In some embodiments, the first conductive type is p-type, and the second conductive type is n-type. In some embodiments, the transistor has a source terminal, a drain terminal and a gate terminal. The source terminal and the drain terminal are n-doped regions within the first semiconductor well. The gate terminal is formed over a channel region between the source terminal and the drain terminal. In some embodiments, the semiconductor structure further includes an insulating layer formed over the topside and covering the transistor. Each of the source terminal, the drain terminal and the gate terminal is connected to an electrode extending to a top surface far away the topside. Each of the electrodes is connected to a conductive line formed over the insulating layer. The conductive lines overlap the first semiconductor doped regions. In some embodiments, the conductive lines further overlap the first semiconductor well and the second semiconductor well.

In one or more embodiments of the present disclosure, the semiconductor device is a second semiconductor region of the second conductive type. The second semiconductor region is formed within the first semiconductor well. The semiconductor wafer further includes a second TSV. The second TSV extends into the second semiconductor region from the backside through the first and second semiconductor wells and is filled with a conductive material.

In summary, the TSVs in the semiconductor structure form an improved guard ring structure, and contacts of the improved guard ring structure are located on the backside of the semiconductor wafer. The metal routing of the semiconductor device can be designed above the topside of the semiconductor wafer. Thus, the contacts of the guard ring structure and the metal routing of the transistor are two un-relative metal routing located on the two sides of the wafer respectively. The guard ring pick up routing is not necessary on topside of the wafer, thereby facilitating chip reduction.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

DETAILED DESCRIPTION

Figure 1A:
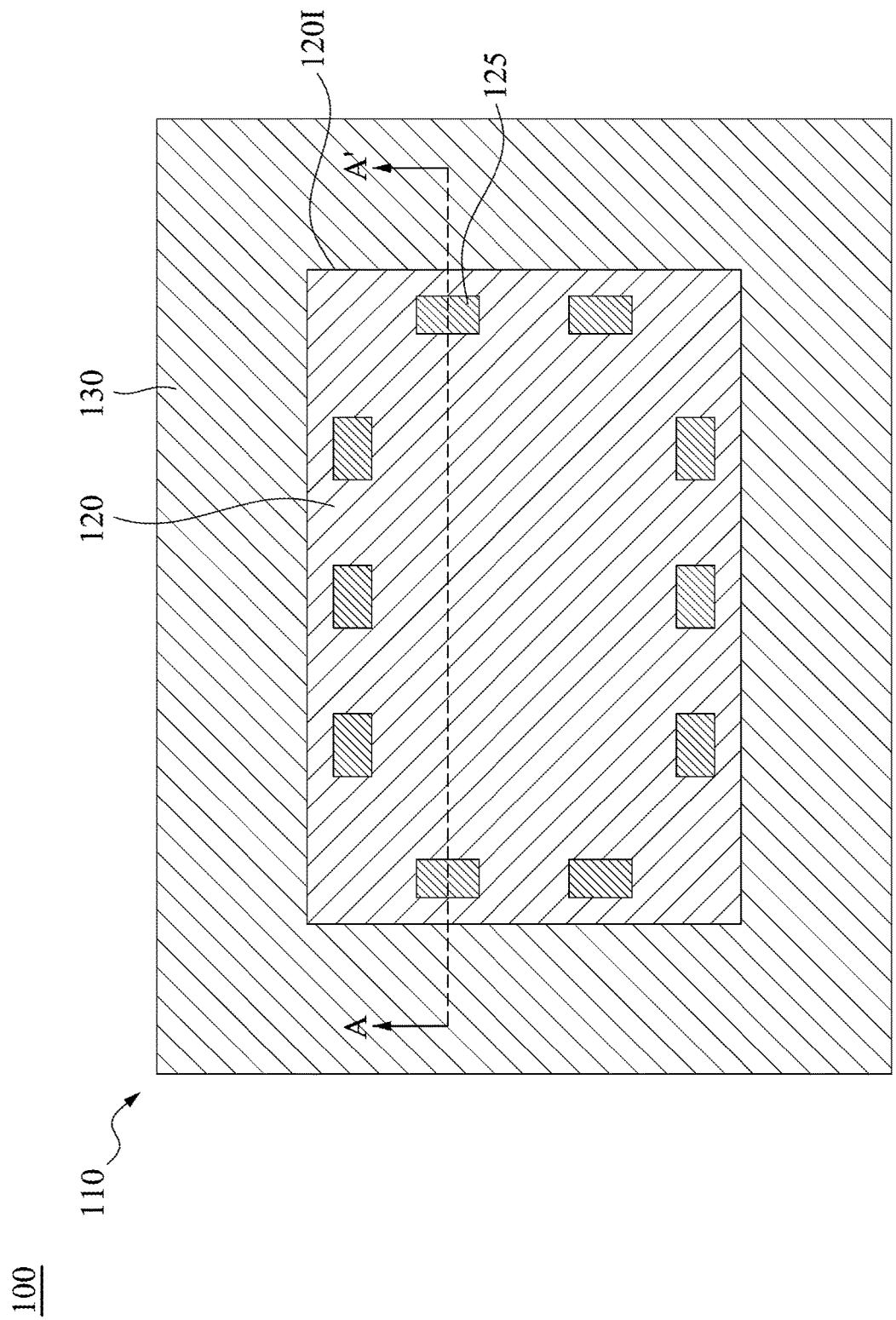
FIG. 1A is a schematic top view of a guard ring structure according to one embodiment of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

Figure 1B:
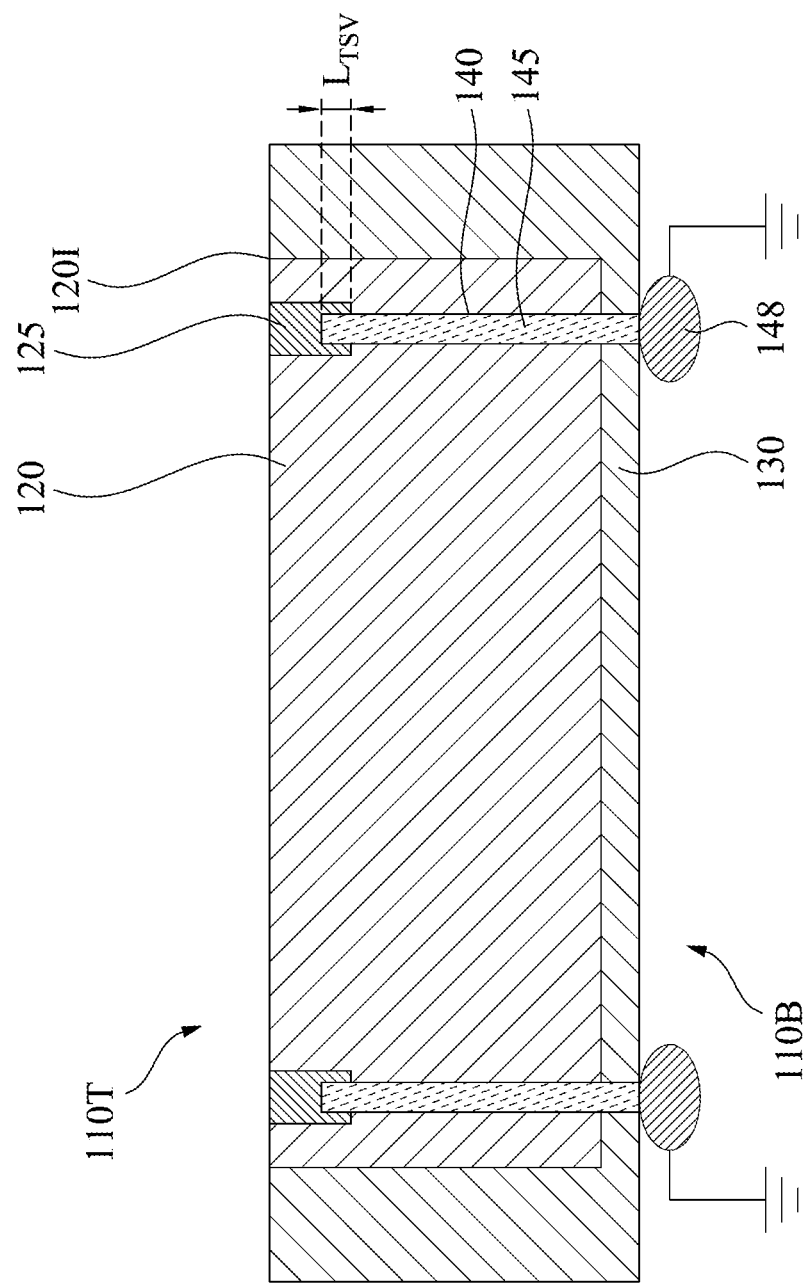
FIG. 1B is a cross section along line A-A' of FIG. 1A.

Please refer to FIG. 1A and FIG. 1B. FIG. 1A is a schematic top view of a guard ring structure according to one embodiment of the present disclosure. FIG. 1B is a cross section along line A-A' of FIG. 1A. As shown in FIG. 1A, a guard ring structure 110 includes a wafer 110. The wafer 110 includes two semiconductor wells. In this embodiment, the wafer 110 includes a P well 120 and a N well 130. The P well 120 is located within the N well 130. The interface 1201 is between the P well 120 and the N well 130. Within the P well 120, a plurality of P-doped regions 125 are P-type semiconductor regions with greater carrier concentration than the P well 120, and the P-doped regions 125 are close to the edges of P well 120. In other words, the P-doped regions 125 are close to the edges of P well 120 is close to the interface 1201. Therefore, the centered regions of the P well 120 are surrounded by P-doped regions 125, and a protected semiconductor device (e.g. a transistor) can be configured at the centered regions of the P well 120. The P-doped regions 125 form a ring-shape region surrounding centered regions of the P well 120. Each P-doped region 125 has a ground potential, and the P-doped regions 125 form a guard ring.

The P well 120 is located within the N well 130, and the N well 130 surrounds the P well 120. The P well 120 is exposed to the topside 110T of the wafer 110. The P-doped regions 125 are also exposed to the topside 110T of the wafer 110. As shown in FIG. 1B, the guard ring 100 structure includes a plurality of through silicon vias (TSVs) 140. The through silicon vias 140 can be formed through a through silicon via process. From the backside 110B of the wafer 110, each of the first through silicon vias 140 respective extends into one of the P-doped regions 125 through P well 120 and N well 130, and each of the through silicon via 140 is filled with a conductive material 145. For a through silicon via 140, the length $L_{TSV}$ extending to the P-doped region 125 is greater than 10 nm to ensure that the conductive material 145 contacts the P-doped region 125.

In FIG. 1B, the conductive bumps 148 are located on the backside 110B of the wafer 110. In this embodiment, each through silicon via 140 is connected to a corresponding P-doped region 125, and each of the conductive bumps 148 is connected to one of the through silicon via 140. Therefore, as shown in FIG. 1B, users can connect a ground potential to each conductive bump 148, and it avoid undesired conduction between PN junctions. In this embodiment, each conductive bump 148 has a ground potential, and the corresponding P-doped region 125 also has a ground potential. Since the P-doped regions 125 have a ground potential, the leakage current from the semiconductor device formed within the centered regions of the P well 120 flows into the P-doped regions but not flow into the N well 130 through the interface 1201.

Figure 2A:
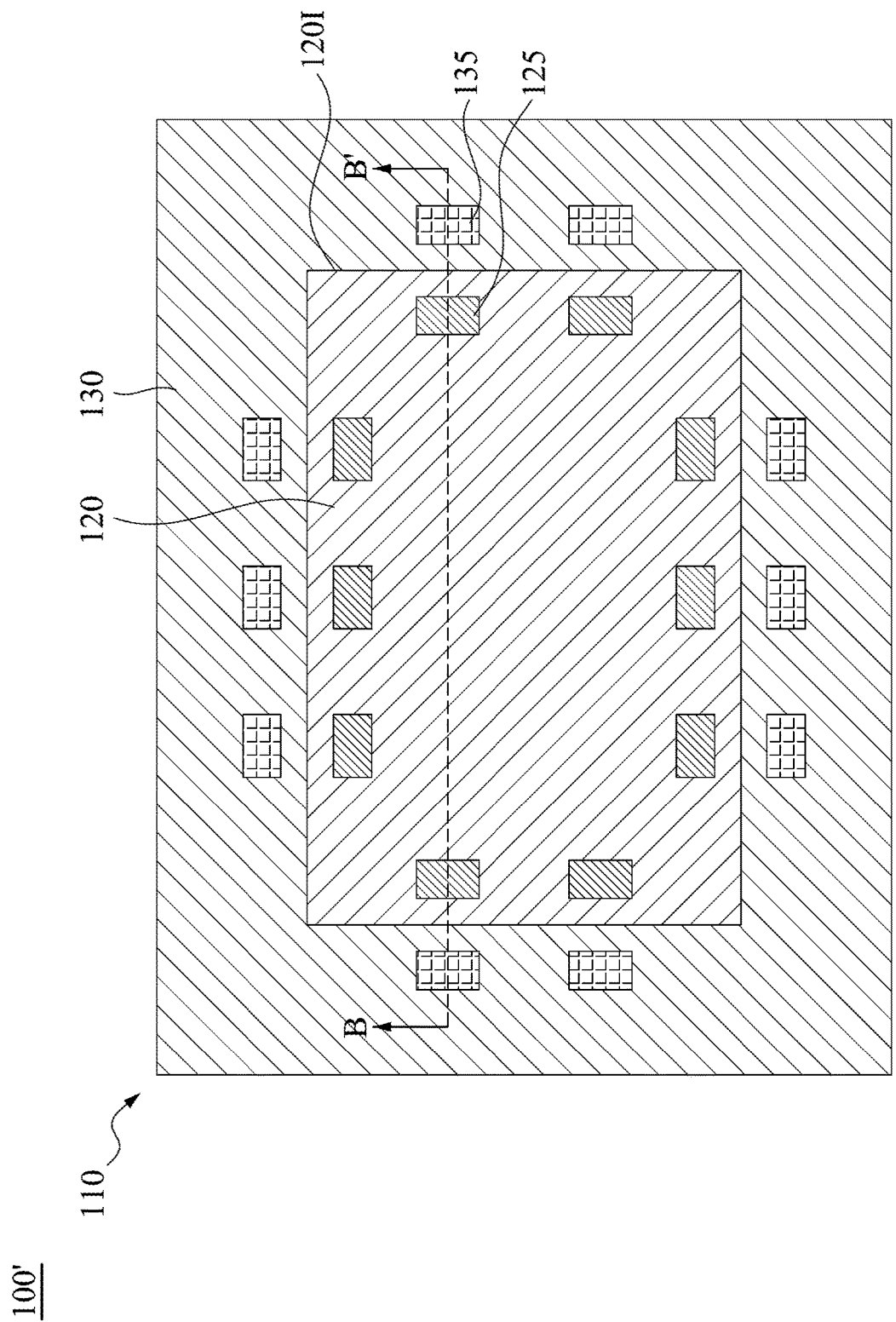
FIG. 2A is a schematic top view of a guard ring structure according to one embodiment of the present disclosure.
Figure 2B:
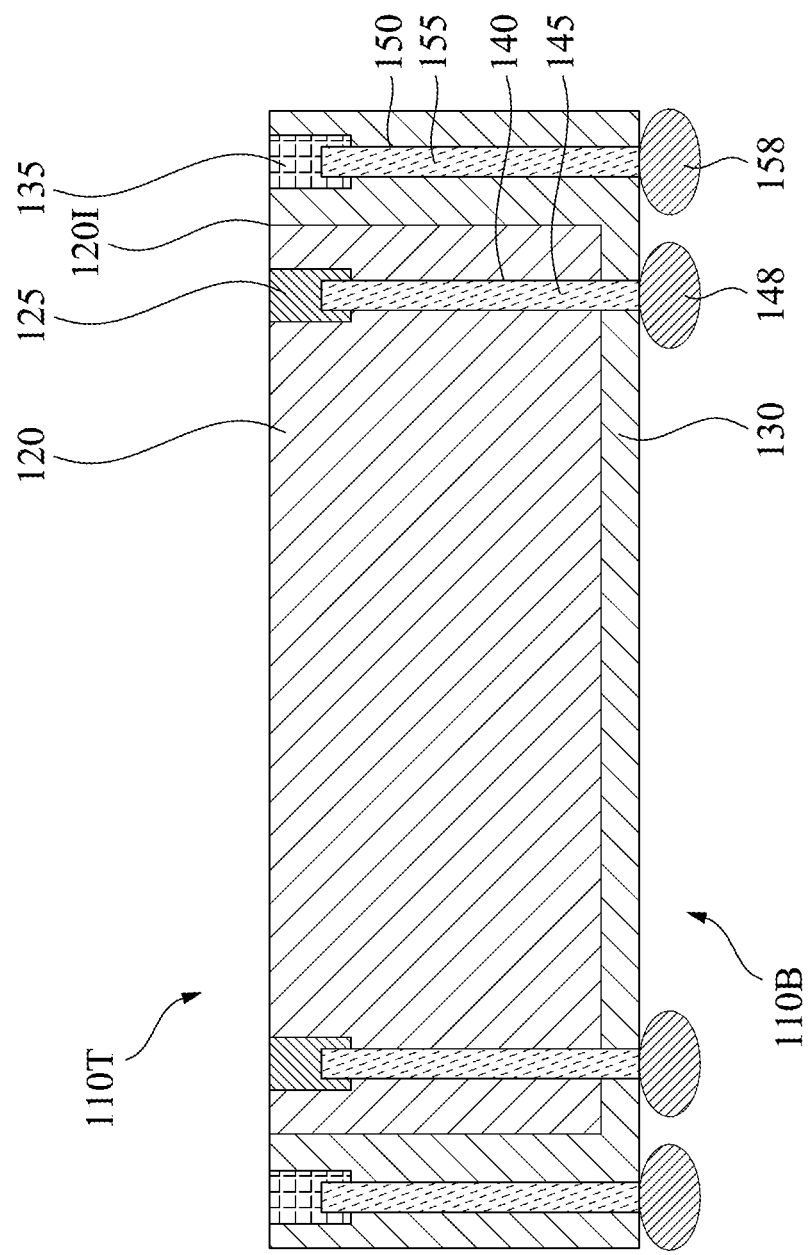
FIG. 2B is a cross section along line B-B' of FIG. 2A.

Please refer to FIGS. 2A and 2B. FIG. 2A is a schematic top view of a guard ring structure 100' according to one embodiment of the present disclosure. FIG. 2B is a cross section along line B-B' of FIG. 2A.

As shown in FIG. 2A, the difference between the guard ring structure 100 in FIG. 1A and the guard ring structure 100' is that the guard ring structure 100' further includes a plurality of N-doped regions 135 within the N well 130. The N-doped regions 135 have a greater carrier concentration than the N well 130. Further, each N-doped region 135 is connected to a corresponding through silicon via 150. As shown in FIG. 2B, each through silicon vias 150 extends into a corresponding one of the N-doped regions 135 from the backside 110B through the N well 130. The conductive material 155 fills the through silicon vias 150. A plurality of conductive bumps 158 connect to the through silicon vias 150 respectively. Similarly, each of the through silicon vias 150 has a length extending into one of the N-doped regions 135 to ensure the connection between the N-doped regions 135 and the conductive bumps 158. The N-doped regions 135 are close to the edge of the P well 120 and surround the P well 120. In other words, the N-doped regions 135 are close to the interface 1201. In this embodiment, a P-doped region 125 is symmetric with a corresponding N-doped region 135 with respect to the interface 1201. In some embodiments, the one of the P-doped regions 125 cannot have a corresponding symmetric one of the N-doped regions 135, and the N-doped regions 135 still form a ring shape surrounding the P well 130. Like the conductive bumps 148 in FIG. 1B, the conductive bumps 158 can also be connected to a DC voltage as a driving voltage since each conductive bump 158 is connected to a corresponding N-doped region 135, and it can further avoid the leakage current.

Figure 3:
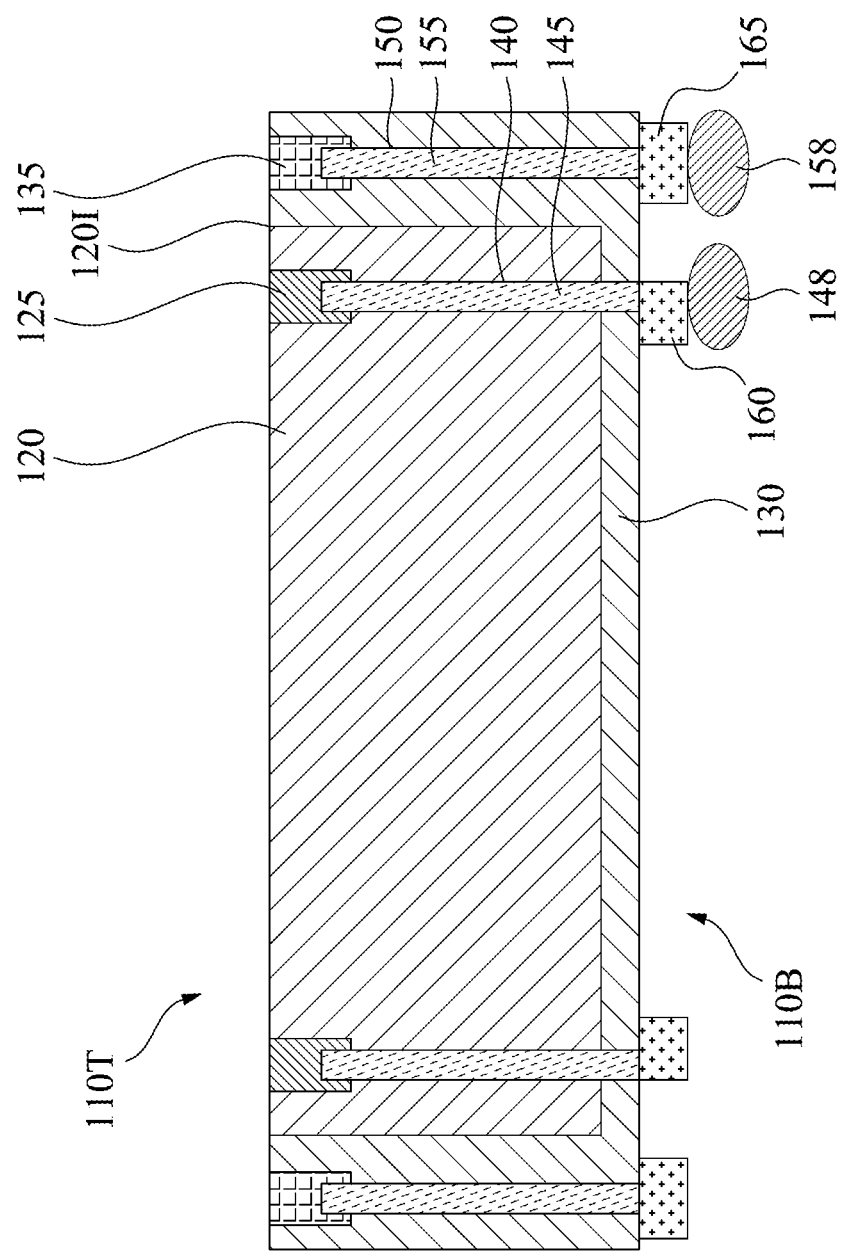
FIG. 3 is a schematic cross section of another guard ring structure according to one embodiment of the present disclosure.

In some embodiments, the redistribution layers can be formed and designed to group the same voltage with through silicon vias together, which can reduce the backside 110B of the wafer 110 power arrangement. Please refer to FIG. 3 and FIG. 4. FIG. 3 is a schematic cross section of another guard ring structure according to one embodiment of the present disclosure. The FIG. 4 illustrates a backside of the guard ring structure of FIG. 3.

Figure 4:
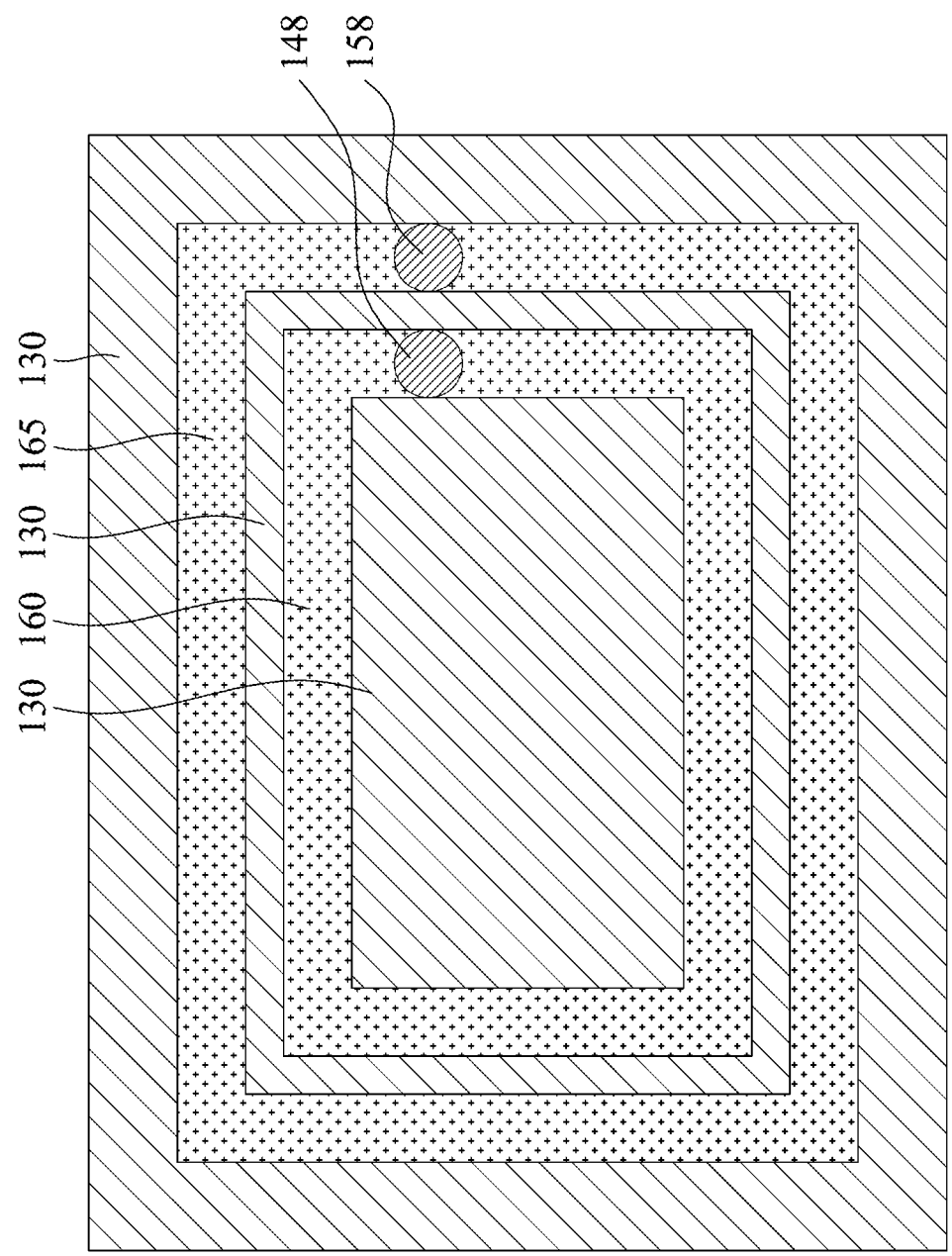
FIG. 4 illustrates a backside of the guard ring structure of FIG. 3.

The difference between the guard ring structure in FIG. 2B and the guard ring structure 100' in FIG. 3 and FIG. 4 is that the additional redistribution layers 160 and 165. As shown in FIG. 3 and FIG. 4, the redistribution layers 160 and 165 are formed over the backside 110B, the redistribution layer 160 is connect to the through silicon vias 140, and the redistribution layer 165 is connected to the through silicon vias 150. Therefore, as shown in FIG. 4, the redistribution layers 160 and 165 have ring shapes respectively, and the ring-shaped redistribution layer 165 surrounds the ring-shaped redistribution layer 160 at the backside 110B. The redistribution layers 160 and 165 have conductive bumps 148 and 158 respectively. The conductive bump 148 is formed over the redistribution layers 160, and the conductive bump 158 is formed over the redistribution layers 165. In FIG. 3, like FIG. 1B, through the connection of the redistribution layers 160 and 165, each of the P-doped regions 125 and N-doped regions 135 can have a ground potential or a DC voltage.

Figure 5A:
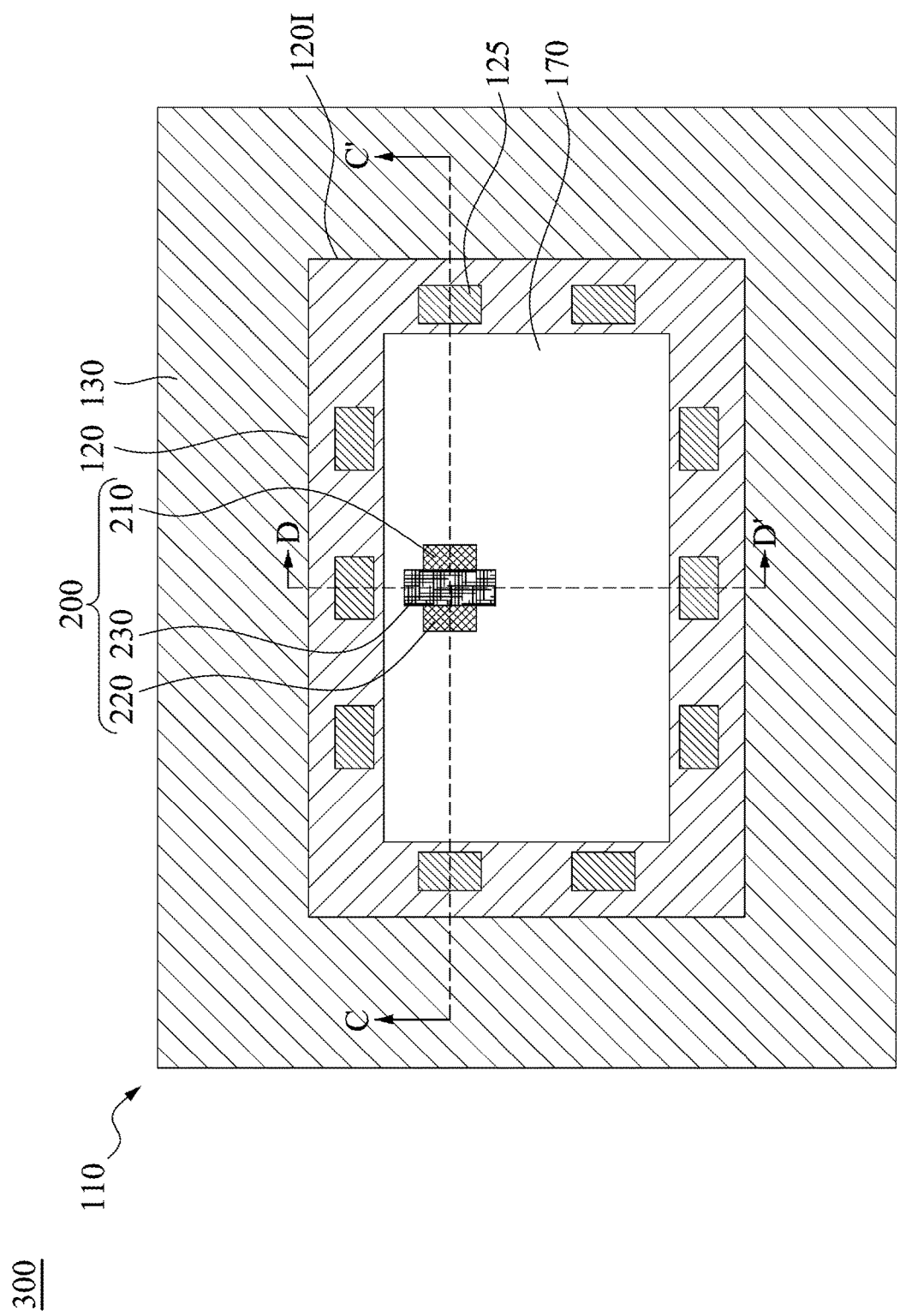
FIG. 5A is a schematic top view of a semiconductor structure according to one embodiment of the present disclosure.
Figure 5B:
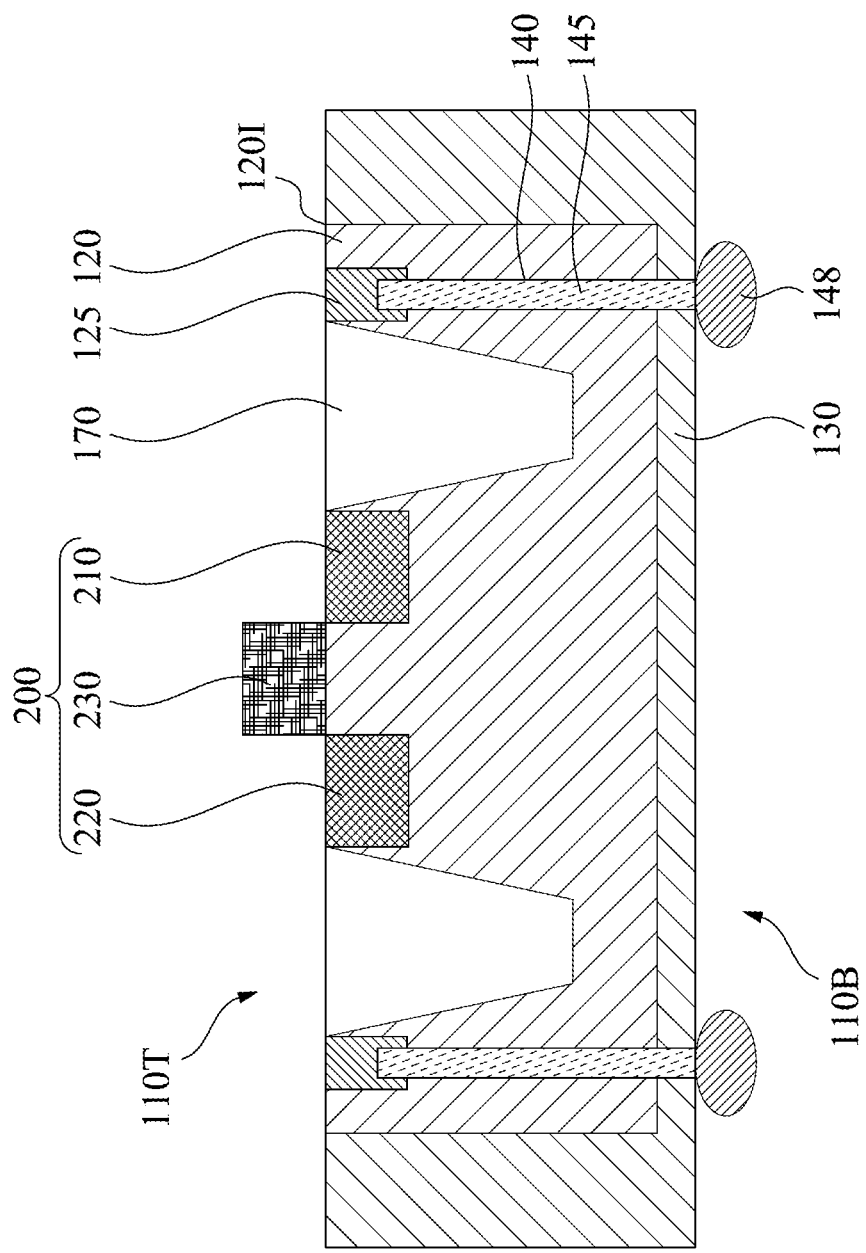
FIG. 5B is a cross section along line C-C' of FIG. 5A.
Figure 5C:
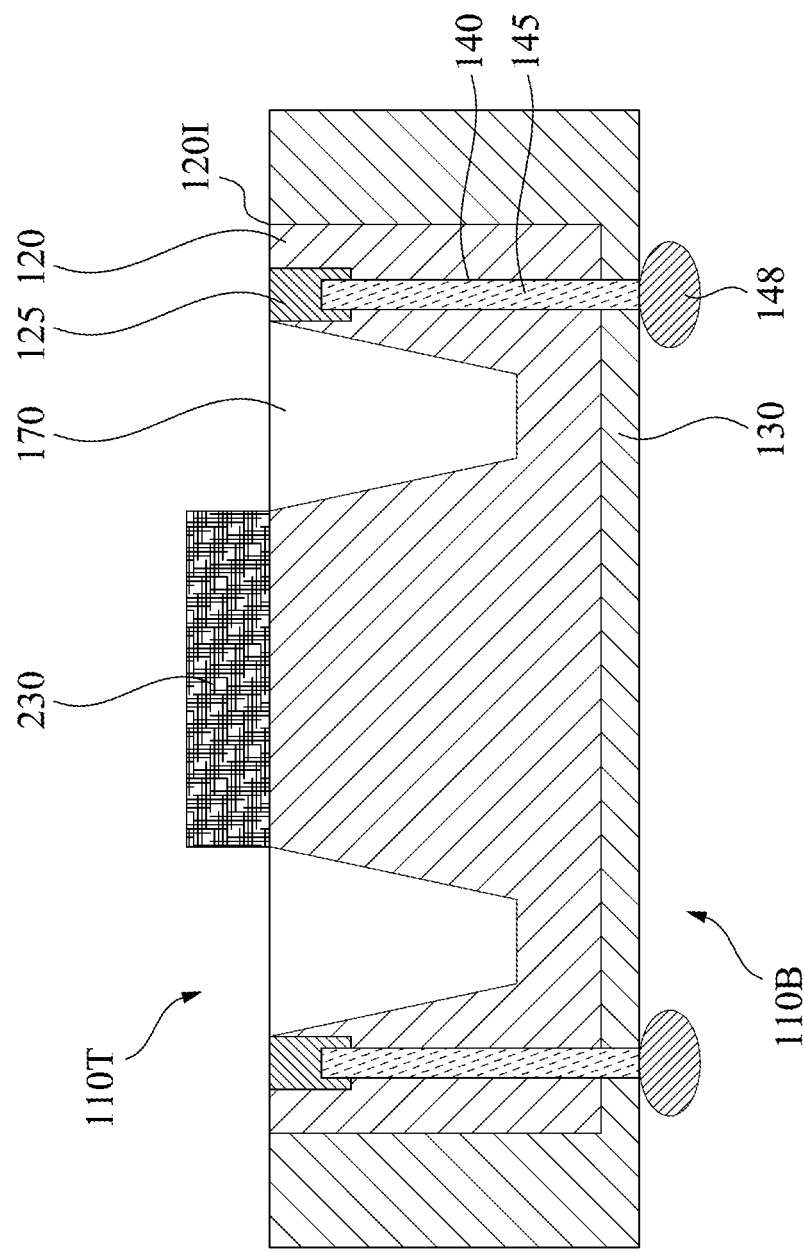
FIG. 5C is a cross section along line D-D' of FIG. 5A.

Please refer to FIG. 5A and FIG. 5B. FIG. 5A is a schematic top view of a semiconductor structure 300 according to one embodiment of the present disclosure. FIG. 5B is a cross section along line C-C' of FIG. 5A. The semiconductor structure 300 use the similar guard ring structure as illustrated in FIG. 1A. As shown in FIGS. 5A and 5B, a transistor 200 is formed within the P well 120. The transistor 200 is an N-MOS but not limited to the present disclosure. The transistor includes a source terminal 210, a drain terminal 220 and a gate terminal 230. The transistor 200 is an N-MOS formed in the P well 120, the source terminal 210 and the drain terminal 220 are N-doped regions, and the gate terminal 230 is formed over a channel region, which is a portion of the P well 120 between the source terminal 210 and the drain terminal 220. In addition, an isolation region 170 is formed between the P-doped regions 125 and the transistor 200. The transistor is surrounded by the isolation region 170. As shown in FIG. 5B, the isolation region 170 is formed within the P well 120 and closed to the topside 110T of the wafer 110. FIG. 5C is a cross section along line D-D' of FIG. 5A and further illustrate the surrounding of the isolation region 170.

In this embodiment, when the transistor 200 operates, the P-doped regions 125 can have a ground potential to avoid undesired conduction between the P well 120 and the N well 130. In some embodiments, a P-MOS can be formed within the N well 130, and the P-doped regions 125 with a ground potential can prevent carriers from passing through the interface between the P well 120 and N well 130 to unexpectedly conduct the PMOS and the NMOS.

Figure 6:
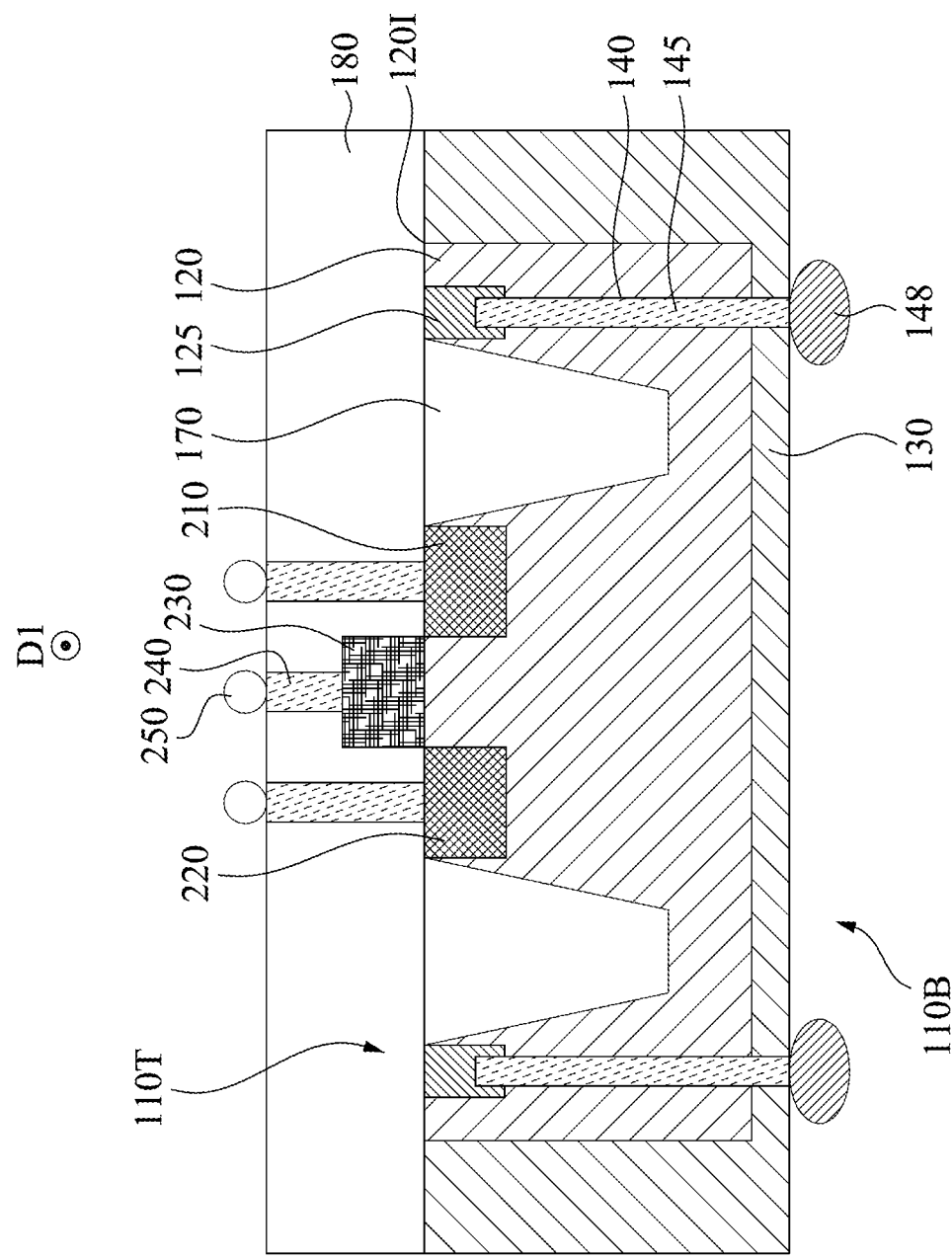
FIG. 6 is a schematic cross section illustrating that an insulating layer, electrodes and conductive lines are formed on the topside of the semiconductor structure of FIG. 5A.
Figure 7:
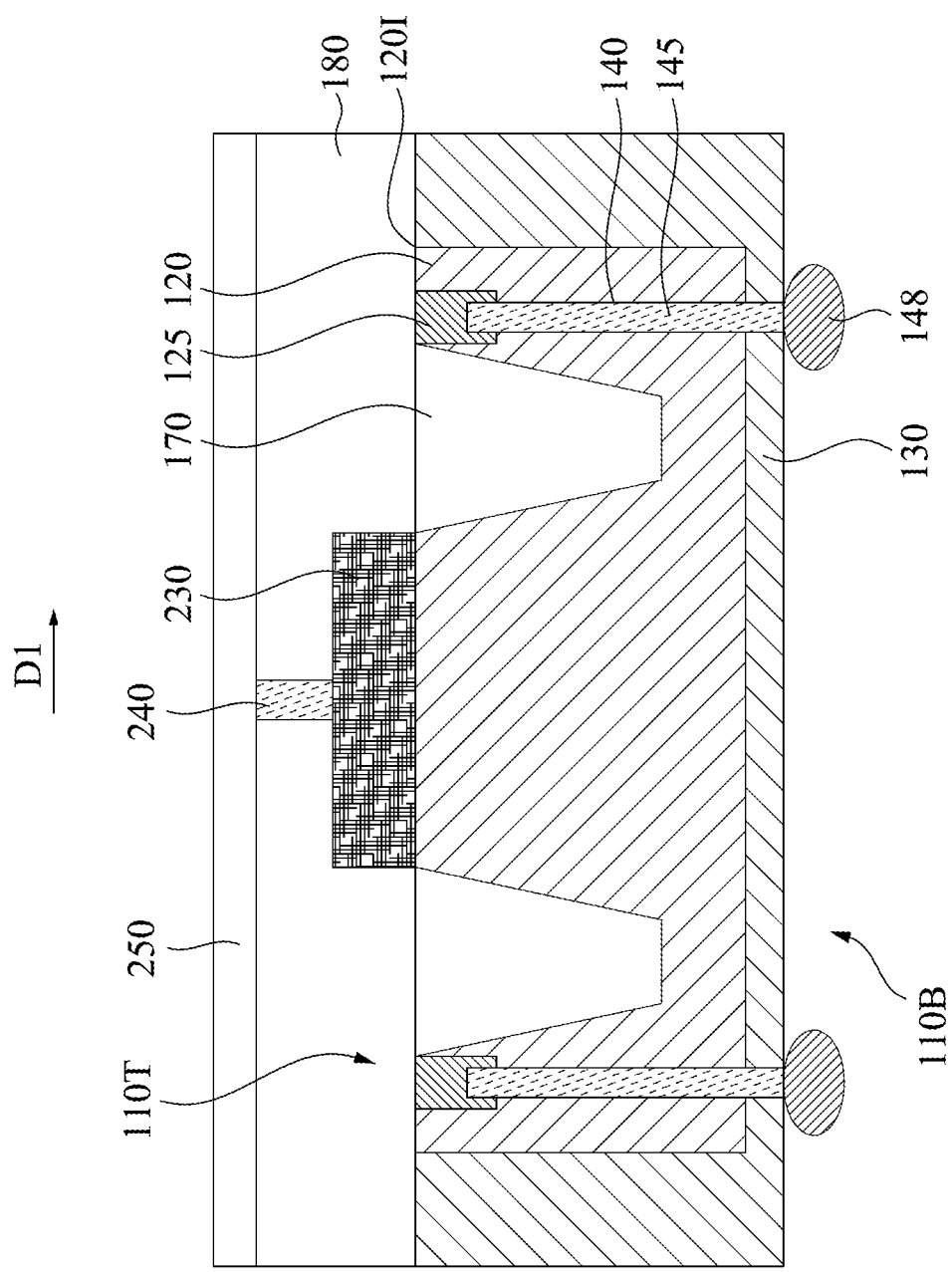
FIG. 7 is another schematic cross section illustrating that an insulating layer, electrodes and conductive lines are formed on the topside of the semiconductor structure of FIG. 5A.

Please refer to FIG. 6 and FIG. 7. FIG. 6 is a schematic cross section illustrating that an insulating layer 180, electrodes 240 and conductive lines 250 are formed on the topside 110T of the semiconductor structure 300 of FIG. 5A. FIG. 7 is another schematic cross section illustrating that an insulating layer 180, electrodes 240 and conductive lines 250 are formed on the topside 110T of the semiconductor structure 300.

As illustrated in FIGS. 6 and 7, to operate the transistor 200, electrodes 240 and conductive lines 250 are necessary. An insulating layer 180 is formed over the topside 110T and covers the transistor 200. The electrodes 240 are provided. Each of the source terminal 210, the drain terminal 220 and the gate terminal 230 is connected to an electrode 240 extending to a top surface of the insulating layer 180, and the top surface far away the topside 110T of the wafer 110. The conductive lines 250 are provided to electrically connect the electrodes 240 respectively. In some embodiments, controlling signal can be transfer to control and operate the transistor 200 through the conductive lines 250.

As shown in FIGS. 6 and 7, in this embodiment, the conductive lines extend along a direction D1. In FIG. 6, the direction D1 is vertical to a direction from the source terminal 210 and drain terminal 220 and out of paper, In FIG. 7, the direction D1 extends from a side of the gate terminal 230 to another side. Therefore, the conductive lines 250 can overlap the P-doped regions 125, as shown in FIG. 7. The only one spacer between the conductive lines 250 and the P-doped regions 125 is the insulating layer 180. Further, in this embodiment, the conductive lines 250 overlap the P well 120 and the N well 130. Since the conductive bumps 148 of the P-doped regions 125 are located over the backside 110B of the wafer 110, the conductive lines 250 on the top surface of the insulating layer 180 are no longer needed to circumvent conductive bumps 148. Therefore, the contacts of the guard ring structure (e.g. the P-doped regions 125) and the metal routing (e.g. the conductive lines 250) of the transistor 200 are two un-relative metal routing located on the two sides of the wafer 100 respectively. The guard ring pick up routing is not necessary on the topside 110T of the wafer 110, thereby facilitating chip reduction.

Figure 8A:
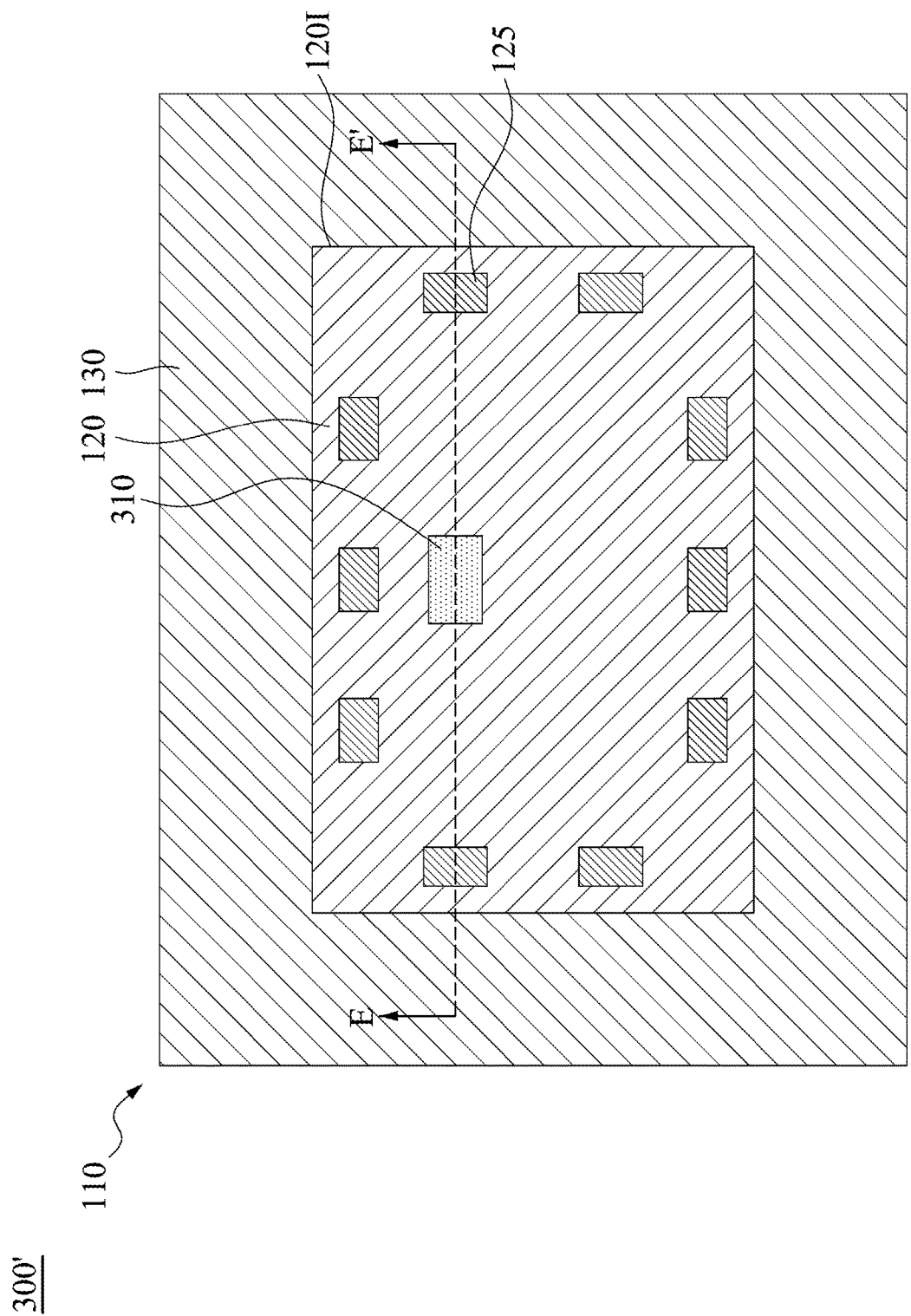
FIG. 8A is a schematic top view of a semiconductor structure according to one embodiment of the present disclosure.
Figure 8B:
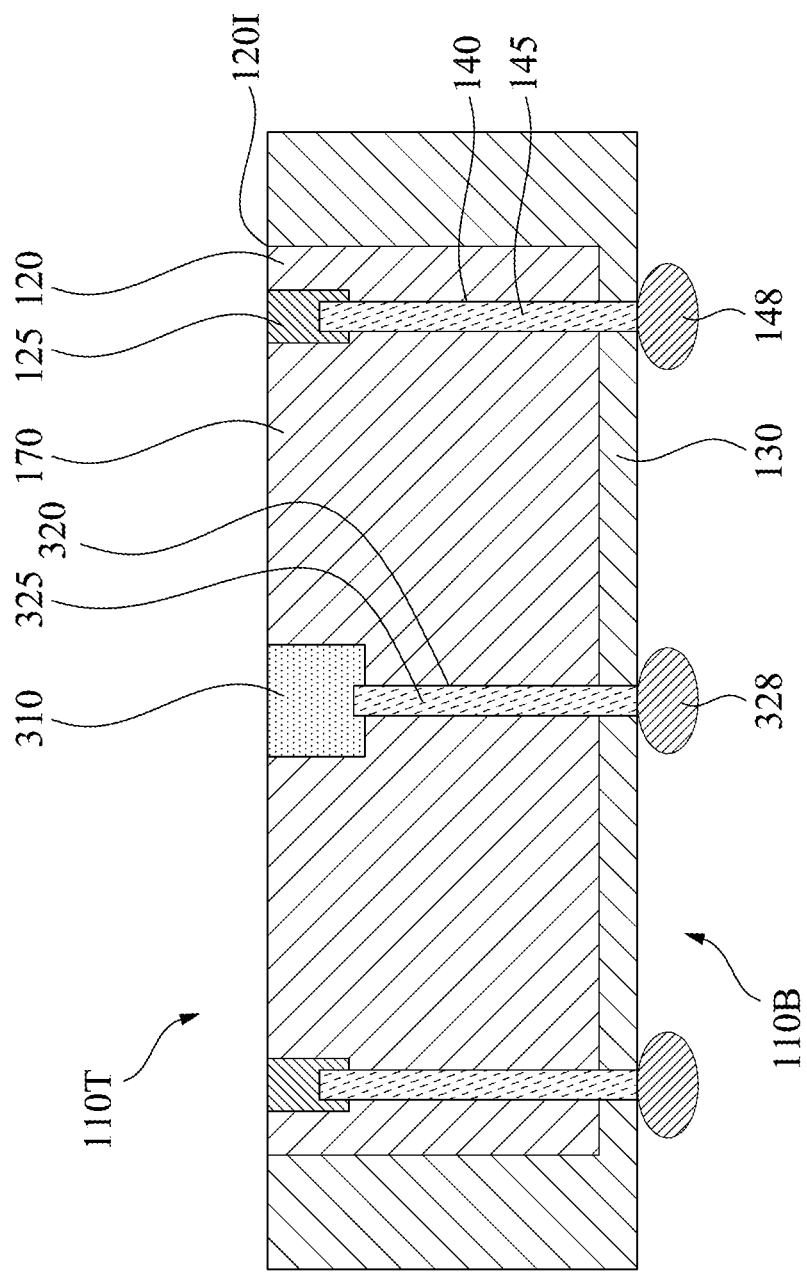
FIG. 8B is a cross section along line E-E' of FIG. 8A.

Please refer to FIG. 8A and FIG. 8B. FIG. 8A is a schematic top view of a semiconductor structure 300' according to one embodiment of the present disclosure. FIG. 8B is a cross section along line E-E' of FIG. 8A. The semiconductor structure 300' in FIG. 8A and FIG. 8B illustrates a diode formed within a guard ring structure.

In FIG. 8A, an N-doped region 310 is formed within the P well 120 and surrounded by the P-doped regions 120. In FIG. 8B, as shown in the cross section along line E-E' of FIG. 8A, a through silicon via 320 is formed and extends into the N-doped region 310. The conductive material 325 is filled with the through silicon via 320. The conductive bump 328 is formed over the backside 110B of the wafer 110 and connected to the through silicon via 320. In this embodiment, the N-doped region 310 and the P well 120 form a diode (e.g. a PN junction) operated by a DC bias. Therefore, like FIG. 1B, the conductive bump 328 can have a DC voltage. The conductive bumps 148 and 328 can be all located on the backside 110B to save area, and it is easy to operate the diode.

In summary, the semiconductor structure with the improved guard ring structure is provided. The doped regions and the TSVs extending to the backside of the semiconductor wafer form the improved guard ring structure. The electric contacts of the improved guard ring structure are located at the backside of the wafer, and the area of the topside of the wafer can be saved. For example, a transistor is formed on the topside of the semiconductor wafer, the doped regions of the guard ring structure surround the transistor, and the contacts of the doped regions extends from the backside through the TSVs. Thus, the metal routing of the semiconductor device can be designed above the topside of the semiconductor wafer, and the metal routing can overlap the guard ring structure. The contacts of the improved guard ring structure and the metal routing of the transistor are two un-relative metal routing located on the two sides of the wafer respectively. The guard ring pick up routing is not necessary on topside of the wafer, thereby facilitating chip reduction.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. A semiconductor structure, comprising:
   a semiconductor wafer having a topside and a backside, wherein the semiconductor wafer comprising:
   a first semiconductor well of a first conductive type;
   a second semiconductor well of a second conductive type different from the first conductive type, wherein the first semiconductor well is disposed within the second semiconductor well and exposed to the topside;
   a semiconductor device formed within the first semiconductor well;
   a plurality of first semiconductor doped regions of the first conductive type, wherein the first semiconductor doped regions are disposed within the first semiconductor well to surround the semiconductor device;
   a plurality of first through silicon vias (TSVs), wherein each first TSV extends into a corresponding one of the first semiconductor doped regions from the backside through the first and second semiconductor wells and is filled with a conductive material, and each first TSV is connected to a DC voltage or a ground potential from the backside; and
   a plurality of conductive bumps, wherein each conductive bump is disposed on the backside and connected to a corresponding one of the first TSVs, and each conductive bump is connected to a DC voltage or a ground potential.

2. The semiconductor structure of claim 1, wherein the semiconductor wafer further comprises:
   a plurality of second doped semiconductor regions of the second conductive type, wherein the second semiconductor doped regions are disposed within the second semiconductor well and surround the first semiconductor well; and
   a plurality of second TSVs, wherein each second TSV extends into a corresponding one of the second semiconductor doped regions from the backside through the second semiconductor well and is filled with a conductive material.

3. The semiconductor structure of claim 1, wherein the semiconductor device is a transistor, and the semiconductor wafer further comprises:
   an isolation region disposed between the first semiconductor doped regions and the transistor, wherein the transistor is surrounded by the isolation region.

4. The semiconductor structure of claim 3, wherein the semiconductor wafer further comprises:
   an insulating layer formed over the topside and covering the transistor,
   a conductive line formed over the insulating layer and connected to the transistor, wherein the conductive line overlaps the first semiconductor doped regions.

5. The semiconductor structure of claim 3, wherein the first conductive type is p-type, and the second conductive type is n-type.

6. The semiconductor structure of claim 5, wherein the transistor has a source terminal, a drain terminal and a gate terminal, the source terminal and the drain terminal are n-doped regions within the first semiconductor well, and the gate terminal is formed over a channel region between the source terminal and the drain terminal.

7. The semiconductor structure of claim 6, further comprising:
   an insulating layer formed over the topside and covering the transistor, wherein the insulating layer has a top surface far away the topside,
   wherein each of the source terminal, the drain terminal and the gate terminal is connected to an electrode extending to the top surface, each of the electrodes connected to a conductive line formed over the top surface of the insulating layer, and the conductive lines overlap the first semiconductor doped regions.

8. The semiconductor structure of claim 7, wherein the conductive lines further overlap the first semiconductor well and the second semiconductor well.

9. The semiconductor structure of claim 1, wherein the semiconductor device is a second semiconductor region of the second conductive type, the second semiconductor region is formed within the first semiconductor well, and the semiconductor wafer further comprising:
   a second TSV extending into the second semiconductor region from the backside through the first and second semiconductor wells and filled with a conductive material.

10. A semiconductor structure, comprising:
    a semiconductor wafer having a topside and a backside, wherein the semiconductor wafer comprising:
    a first semiconductor well of a first conductive type;
    a second semiconductor well of a second conductive type different from the first conductive type, wherein the first semiconductor well is disposed within the second semiconductor well and exposed to the topside;
    a semiconductor device formed within the first semiconductor well;
    a plurality of first semiconductor doped regions of the first conductive type, wherein the first semiconductor doped regions are disposed within the first semiconductor well to surround the semiconductor device;
    a plurality of first through silicon vias (TSVs), wherein each first TSV extends into a corresponding one of the first semiconductor doped regions from the backside through the first and second semiconductor wells and is filled with a conductive material, and each first TSV is connected to a DC voltage or a ground potential from the backside; and
    a redistribution layer disposed on the backside, wherein the redistribution layer is connected to the first TSVs and a conductive bump is disposed over the redistribution layer, and the conductive bump is connected to a DC voltage or a ground potential.

\* \* \* \* \*